United States Patent [19]

Hamilton

[11] 4,025,786
[45] May 24, 1977

[54] SOLAR ENERGY POWER GENERATING ARRAY

[76] Inventor: George Henry Hamilton, 1425 Fourth St., SW., Washington, D.C. 20024

[22] Filed: Jan. 2, 1975

[21] Appl. No.: 538,156

[52] U.S. Cl. .................... 250/211 R; 136/89 P; 250/578
[51] Int. Cl.² .................................. H01J 39/12
[58] Field of Search ............ 250/211 R, 211 J, 201, 250/578, 203; 338/15, 17; 136/89

[56] References Cited

UNITED STATES PATENTS

| 3,593,026 | 7/1971 | Uchida et al. | 250/203 |
| 3,619,620 | 11/1971 | Ring | 250/201 |
| 3,715,599 | 2/1973 | Marcy | 250/201 |

Primary Examiner—David C. Nelms

[57] ABSTRACT

A multi-layer array of power converting elements for converting electromagnetic energy such as sunlight incident on the array to electricity is disclosed. The array is suitable for use in integrated circuit arrays as well as discrete circuit arrays. The array comprises an upper layer of photocells with spaces between the photocells. At least one other layer of photocells is disposed below the upper layer and is illuminated by the penumbra of the upper layer. Lower layers are separated from upper layers by a distance defined by the width of the cells in the immediate upper layer, the distance between the array and the source of electromagnetic energy and the width of the source of electromagnetic energy.

17 Claims, 9 Drawing Figures

SOLAR ENERGY POWER GENERATING ARRAY

BACKGROUND OF THE INVENTION

Recent developments in the environmental and logistical factors governing the supply and consumption of available conventional energy resources have highlighted the urgent need to search for and exploit alternate sources of energy. When one selects a given energy source, he is inevitably faced with a number of difficult problems. Traditionally, the principle sources of energy have been the fossil fuels, such as coal and petroleum. A century ago, these fuels were found in great abundance on earth, but the rapid pace of industrialization, especially in the western economies, has resulted in the rapid consumption of these resources and an unanticipated shortage in their supply.

Today, remaining world reserves of petroleum are rapidly approaching extinction, and even those sources which are producing at relatively high levels have, even now, proven themselves, for reasons not related to availability, to be unreliable. Quite apart from the quantity of remaining fossil fuel and the availability of that fuel, one must also consider the environmental pollution generated in the conversion of fossil fuels into useful energy forms. This problem is particularly acute in the case of coal which often includes large quantities of sulphur. Sulphur compounds enter the air and pollute the atmosphere during combustion of the sulphur-containing fuels. Even nuclear energy, which should be able to supply our energy needs into the visible future, could cause serious pollution problems and, indeed, if the nuclear waste products already produced as a result of past nuclear reactions should be released, the result would be an environmental catastrophe. Thus, even if we were to assume unlimited supplies of energy, increasing industrial development would result in a threat or damage to the environment.

In an attempt to overcome the deficiencies of fossil fuels discussed above, scientists have been led to consider a number of alternative energy sources. Insofar as the sun is ultimately the source of all energy on the earth, the direct use of sunlight appears to be one of the more promising solutions to present energy supply problems. Systems using sunlight as a source of power are already in widespread use throughout the world. For example, many buildings are architecturally designed to take maximum advantage of sunlight for the purpose of heating the building during the winter months, while minimizing the effect of the sun during the summer months. In addition to this, there are a number of commercially available systems which employ sunlight to heat water for use in a building.

Perhaps the most promising application of solar energy is in the generation of electrical power. Systems for doing this generally include an array of photovoltaic devices which are disposed over and completely cover a planar support surface. Photovoltaic devices offer a great deal of advantage in comparison to other solar energy converting devices. For example, the electricity generated may be conventionally sent from point to point over conventional electrical transmission lines. Electric energy is easily converted into other forms of energy and, when obtained from a photocell, is a non-polluting and inexhaustible energy source. These properties have made solar energy cells ideal energy sources in such applications as man-made orbital satellites and the like. However, solar cells suffer from a number of inadequacies which prevent their employment on a widespread scale. Perhaps the chief limiting factor is the limited area which is available for the collection of solar energy. In aerospace systems, this deficiency is compensated for by the use of large area solar panels which extend from the vehicle or satellite and are positioned to receive radiant energy. Even in terrestrial systems, the use of photocells is limited due to the inavailability of large areas for the collection of sunlight energy.

In connection with this, it is noted that the inadequate production of electricity from an array exposed to the sun is not due to an inadequate amount of energy falling on the energy converting cell or cells, but rather to the inefficiency with which conventional photoelectrical devices convert sunlight into electrical energy. Moreover, in addition to the inefficiencies involved in a photocell array, there is a tendency of the cells to saturate at a given level of incident radiation. Thus, as the level of light is increased from zero, the increasing light that is incident on a photocell results in greater electrical output until the saturation level is reached, at which point marginal increases in incident light result in insignificant or nonexistent increases in electrical power output. For most photocells, the threshold level of incident radiation is quite low relative to the intensity of bright sunlight. This problem is especially acute when one wishes to use reflectors or other systems to concentrate sunlight.

SUMMARY OF THE INVENTION

In accordance with the present invention, a solar energy converting array is provided for the generation of useful energy from solar energy. Although the preferred embodiment of the invention contemplates the use of photovoltaic devices, it is understood that any solar energy converting device such as photovoltaic, photothermal or photochemical cells may be used. The inventive array comprises one or a number of multi-layered panels in which separate layers are successively in each other's shadows. The layer of each panel closest to the sun includes a number of electrically connected photocells which receive radiation from the sun directly. Dispersed between the photocells on the first layer are spaces through which sunlight passes, forming shadows that conform to the projection of the photocells on a sphere centered on the sun.

Due to the fact that the sun has a width, light traveling through the blank areas is caused to diverge before reaching a second layer which may or may not include open spaces to permit the illumination of subsequent layers. Although any number of layers could theoretically be used, it is presently contemplated that satisfactory results can be obtained with panels having two or three layers. Each of the layers produces electrical power. The cells on the layer closest to the sun receive direct sunlight, and under normal operating conditions (that is, the absence of heavy clouds or other light-blocking obstructions), subsequent layers will be illuminated by light passing through the empty spaces between the photovoltaic elements of the first layer. Light passing through the first layer via these spaces will diverge into areas of umbra and penumbra until there is a relatively uniform illumination of the next layer. This relatively uniform illumination will be lower in intensity than direct sunlight but is sufficiently high in intensity to obtain substantial though reduced power from the photocells in the lower layers of the panel due to the fact that the lower layers of photocells saturate at relatively low levels of intensity. Insofar as all the photocells operate at close to peak power and the total area of photocells in the multiplicity of layers is greater than the area of a single layer, more electrical power is produced with a given intensity of sunlight. This particular system is especially valuable when employed in photocell arrays wherein the photocells have a relatively high efficiency but which saturate at relatively low intensity. Using a properly designed multi-layer panel, the photocells could be arranged in such a manner as to expose to attenuated light an area of photocells much greater than the area of photocells upon which light is incident in conventional single layer panels. This results in obtaining higher efficiency per unit plane area for high intensity levels by not needlessly saturating the individual photocells in each plane of the array.

In accordance with the present invention, it is also contemplated that an array will include more than one multi-layer panel of photocells. Each of the panels would be oriented with respect to the sun in such a manner that they would produce their peak power output at different times of the day. The output of the panels would then be combined, thereby generating electricity at a relatively uniform rate throughout the day. In accordance with one of the described embodiments of the invention, a further advantage is achieved due to the fact that the orientation of the panels besides achieving a relatively flat power response as a function of time also results in the reflection of unabsorbed sunlight to the adjacent panel structure.

DETAILED DESCRIPTION OF THE PREFERRED EMBODIMENTS

Figure 1:
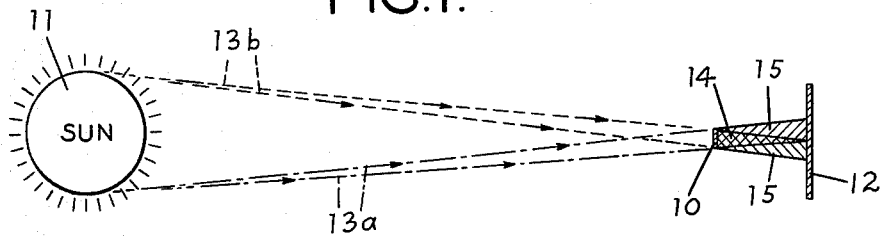
FIG. 1 is a schematic illustration helpful in understanding the principle of the invention.

Referring to FIG. 1, it is seen that an object 10 placed between a source of light 11 such as the sun and a surface 12 will not cast a well-defined shadow. Specifically, due to the fact that the source 11 is not a point source, light rays 13a–b leaving the source from different points will form regions 14 of umbra and regions 15 of penumbra. In the regions of umbra there is no illumination received from the source. In the regions of umbra, only illumination from parts of the source is present. In the region immediately behind object 10 opposite source 11, the region of umbra is relatively large. As we proceed away from the source, the region of umbra becomes smaller and the region of penumbra increases. At the distance where surface 12 is positioned, the region of umbra has completely disappeared and there is instead a region of relatively uniform penumbra.

Some currently available photocells will generally saturate when subjected to light having an intensity approximately 25 percent that of normal bright sunlight. The penumbra on surface 12 is approximately 50 percent the intensity of unattenuated bright sunlight. It is therefore noted the photocells placed in its penumbra will operate at substantially 100 percent power output even if the sunlight is reduced to 50 percent of its bright value. Likewise, even under these conditions a photocell placed on object 10 will also function at substantially 100 percent power output. It is thus seen that object 10 may be a photocell or a multiplicity of photocells positioned to form an array in a specific pattern over a lower layer of photocells. Both of these layers will produce at close peak power output even though one layer of photocells is in the penumbra of the other and even if the intensity of the sun is below its bright value.

Figure 2:
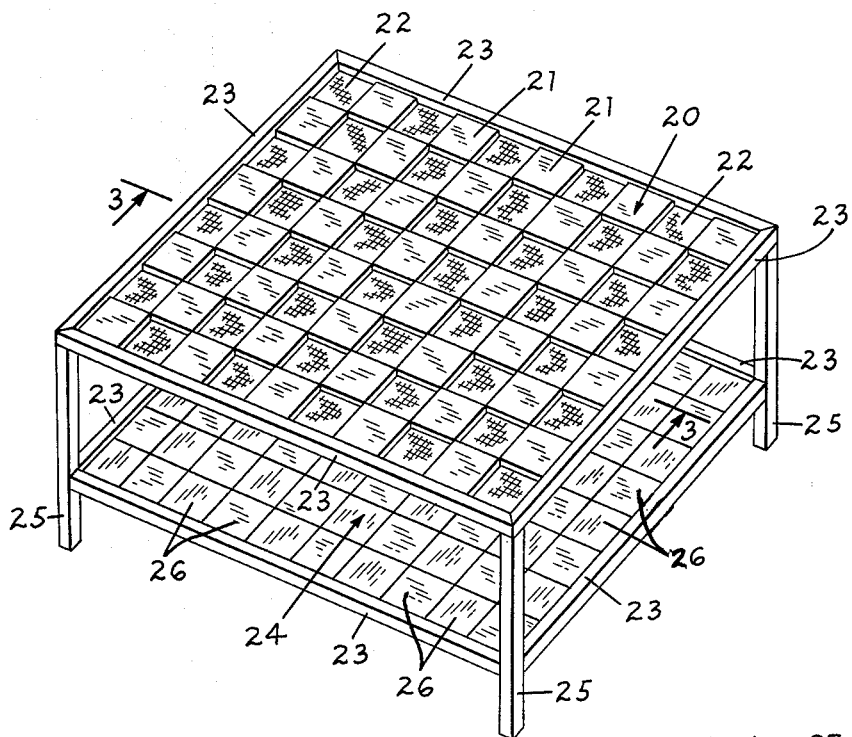
FIG. 2 is a perspective view of a photocell array illustrating one of the aspects of the present invention.

A panel 20 making use of the principle illustrated in FIG. 1 is illustrated in FIG. 2. While this is a two-layer panel, it is generally contemplated that an array will include panels having more than two layers. However, the two-layer panel illustrated in FIGS. 2 and 3 does serve as a most convenient model for the analysis of one aspect of the present invention.

Panel 20 comprises an upper layer of photocells 21. The photocells 21 have a total area equal to half the total face area of the panel and hence block approximately 50 percent of the light incident upon the panel. Cells 21 are supported on a wide mesh screen 22 or other substantially transparent material such as glass, which in turn is secured to four frame elements 23. The upper layer is supported a fixed distance above a lower layer of square cells 24 by a plurality of vertical supports 25. Layer 24 simply comprises a surface completely covered with photocells 26 in substantially continuous fashion. The photocells are supported by four frame elements 23 disposed wholly in the penumbra of incident light rays 27a–b coming from different parts of the source of radiation and passing between photocells 21.

Figure 3:
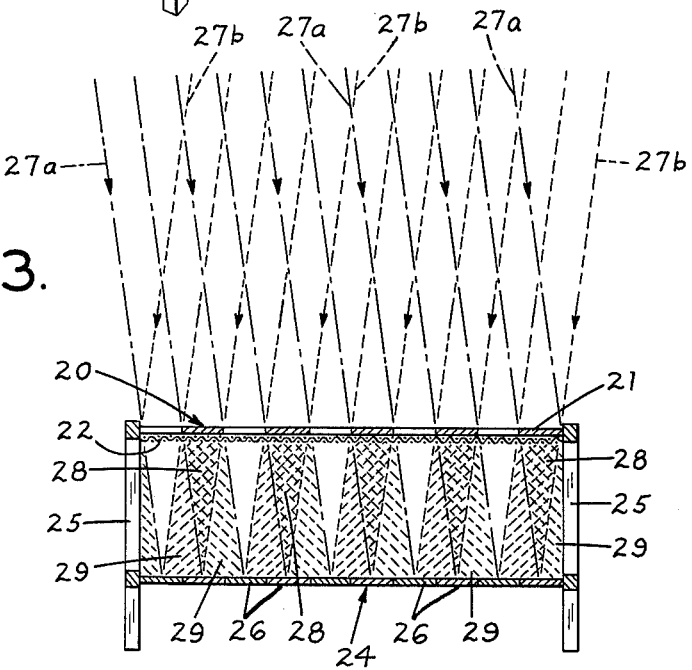
FIG. 3 is a cross-sectional view along lines 3—3 of the photocell array illustrated in FIG. 2.

The distance between the upper and lower layers is maintained by vertical supports 25 at the distance at which the umbra 28 just disappears as is illustrated in FIG. 3. At this distance, layer 24 is totally covered by penumbra and receives light having an intensity which is 50 percent that of a light incident upon photocells 21. Theoretically, this distance is defined by the equation:

$$D_c = D_s w / d_s$$

where $D_c$ is the distance between cell layers, $D_s$ is the distance between the source of light and the panel, $w$ is the width of solar cells in the first layer, and $d_s$ is the diameter of the source of light. In the case of the sun which has a diameter of approximately $1.392 \times 10^{11}$ cm. and a mean distance from the earth of $1.496 \times 10^{13}$ cm., the distance between cell layers has a theoretical value which is 107.5 times the width of cells in the first layer facing the sun. However, empirical measurements have shown that this value is in practice between 50 and 70 times the width of the cell. It is believed that this difference is due to the scattering of light by the atmosphere. Even shorter distances between layers will work, although in most cases a greater distance is preferred.

With the distance between cells 21 and layer 24 approximately 70 times the width of cells 21, the situation illustrated in FIG. 3 is achieved. However, it is noted that FIGS. 2 and 3 are not to scale in order to more clearly illustrate the concept of the invention. Thus, in a typical device, cells 21 might be 1 cm. in width and be separated from layer 24 by a distance of approximately 70 cm. However, it is also contemplated that the panel may take a much smaller size and may be fabricated using microelectronic circuit techniques.

In the device illustrated in FIGS. 2 and 3 areas of umbra 28 have been reduced to zero while layer 24 is completely covered by the penumbra 29 of cells 21. This results in the substantially uniform illumination of layer 24 with a level of intensity which is half that of the light incident upon panel 20. As noted above, insofar as some photocells can produce their maximum output at approximately 25 percent the intensity of bright sunlight, the photocells in layer 24 will produce the same output that they would produce even if the layer containing photocells 21 was not present. Moreover, they will produce at full output for intensities of light ranging down to one half the intensity of bright sunlight. Thus, layer 24 will produce substantially 100 percent of maximum power output for an area equal to that of a conventional photocell panel, and photocells 21 will also produce at substantially 100 percent power output while they cover in a ground area which is half that of a conventional panel.

Figure 4:
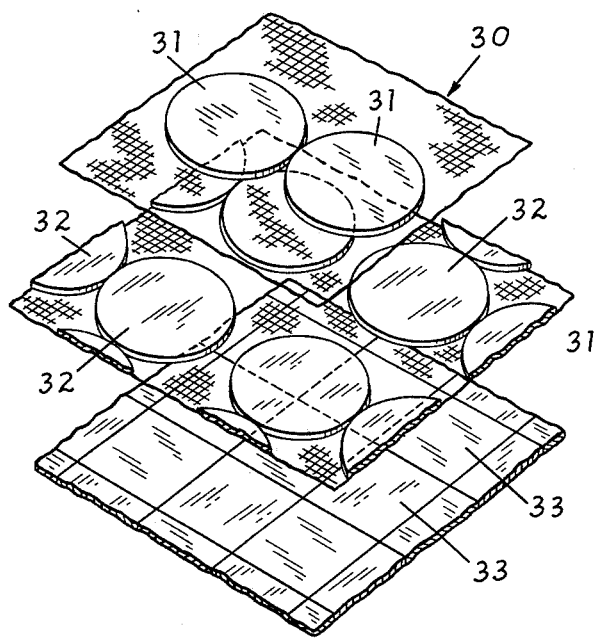
FIG. 4 is a perspective view of a portion of a solar panel constructed in accordance with the present invention.
Figure 5:
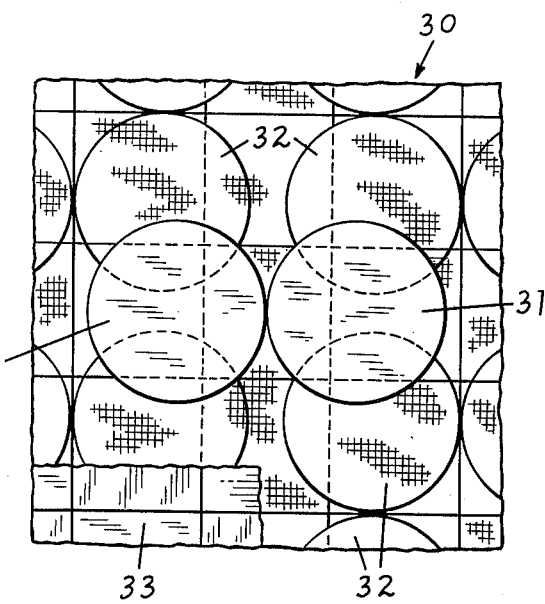
FIG. 5 is a plan view of the embodiment illustrated in FIG. 4.

As noted above, it is not necessary that the multi-layer photocell strategy be limited to two-layer panels. For example, a panel in an array may have three layers as is illustrated in FIGS. 4 and 5. Panel 30 comprises an upper layer of photocells 31, a middle layer of photocells 32 and a lower layer of photocells 33. Photocells 31 and 32 are supported on screening 34 in the same manner as the device illustrated in FIGS. 2 and 3. Moreover, only a portion of the panel has been shown in order to most clearly show the arrangement of the photocells in the layers. An actual panel would include many sections of the kind illustrated in FIGS. 4 and 5. The individual cells would be connected in series or parallel fashion or combinations thereof in the manner that is well known in the art. Again, this device has not been shown to scale and the separation between layers is about 70 times the diameter of the photocells in the top and middle layers. In this device, the top layer comprises two photocells 31 which together have a total area which is approximately one third that of the bottom layer. Likewise, photocells 32 which comprise the middle layer together have a total area which is approximately two thirds that of the lower layer of photocells 33. In bright sunlight all three layers receive enough illumination to allow them to produce substantially maximum power output. The total area of the device is thus twice that of a conventional single layer photocell panel and thus results in more efficient power output for the same area exposed to sunlight. It is contemplated that in a large panel a plurality of the device illustrated in FIGS. 4 and 5 would be placed beside each other in the manner illustrated to form a large panel having three layers.

Figure 6:
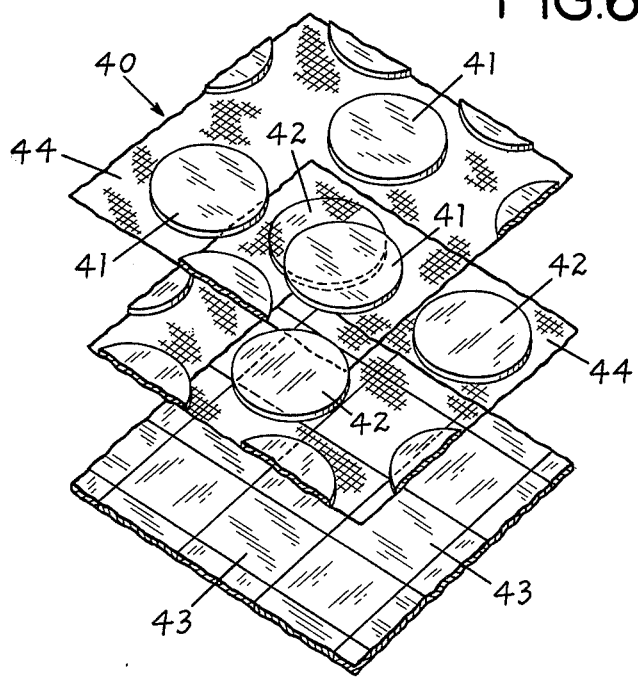
FIG. 6 is a perspective view of a portion of an alternate panel arrangement constructed in accordance with the present invention.
Figure 7:
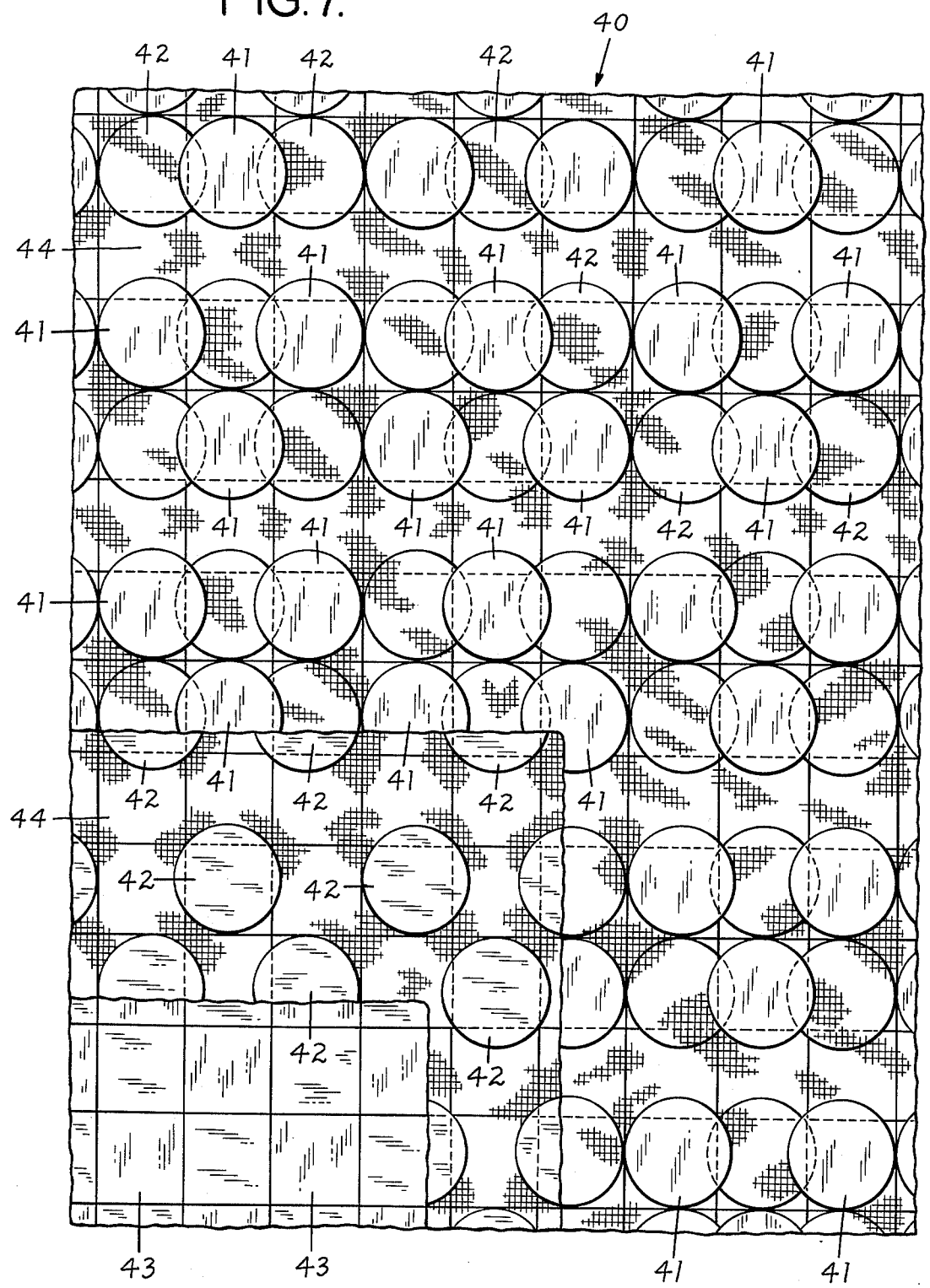
FIG. 7 is a plan view of the embodiment illustrated in FIG. 6 showing a greater portion of the array.

An alternative three-layer panel is illustrated in FIGS. 6 and 7. Panel 40 again has a top layer of photocells 41, a middle layer of photocells 42 and a lower layer of photocells 43. Photocells 41 and 42 are supported on screening 44. The combined surface area of the three photocells 41 is half the surface area of bottom layer 43. Similarly, the combined area of photocells 42 is also half the area of bottom layer 43. In bright sunlight all three layers will receive the minimum intensity of light necessary for producing substantially maximum power output. As a consequence of the fact that a greater area of photocells is exposed to sunlight, the panel will thus function more efficiently than conventional panels.

Figure 8:
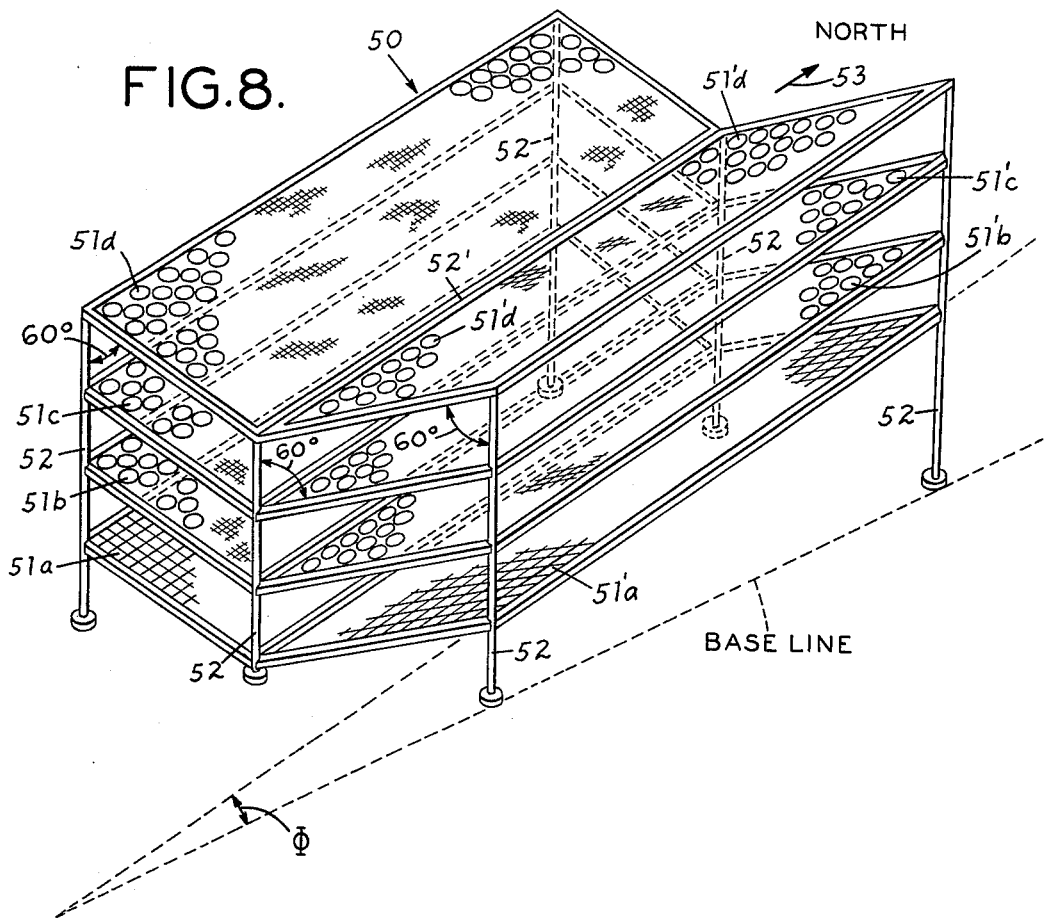
FIG. 8 is a perspective view of a solar power array constructed in accordance with the present invention.

A typical solar energy array is illustrated in FIG. 8. The array 50 comprises a plurality of layers 51a–d and 51'a–d. Layers 51a and 51'a are completely covered with photocells while layers 51b–d and 51'b–d are only partially covered with photocells in order that successive layers below will receive penumbral illumination. The panels are supported by a plurality of supports 52 and are each oriented at an angle of 60° with respect to the supports. The interface 52' of each of the layers extends north to south as indicated by arrow 53. It is also advantageous to incline the array at an angle $\phi$, where $\phi$ approximately equals the latitude of the array site, in order to take maximum advantage of the sun's rays. Thus, the interface 52' in each layer should be oriented in the direction indicated by arrow 53 with its southern tip extending from the earth at an angle equal to the latitude of the site. Each of the layers is separated from the adjacent layer by a distance approximately 70 times the diameter of the photocells in the upper layers.

During operation of the device illustrated in FIG. 8, the use of two multi-layer panels comprising panels 51a–d and 51'a–d respectively results in the more efficient utilization of sunlight incident on the array. Due to the fact that panels 51a–d are oriented in the direction shown in FIG. 8, they will produce their peak power sometime before noon. Similarly, panels 51'a–d will show their peak power during the afternoon. The combined outputs of all the panels will thus show a relatively flat response as the position of the sun changes, even though the arrays are fixed. Still another advantage to be had with the array illustrated in FIG. 8 is the fact that light reflected by the photocells in the panels will, to different extents dependent upon the time of the day, be reflected onto other parts of the array. Thus, a light ray striking panel 51'd in the morning will be reflected onto panel 51d, thereby increasing the amount of light falling on panel 51d and increasing the power output from the panel.

Figure 9:
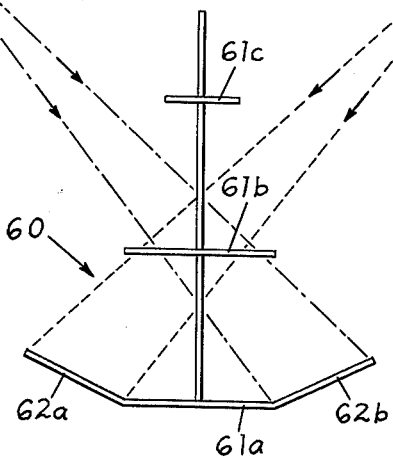
FIG. 9 is an alternative embodiment of a solar power array constructed in accordance with the present invention.

Yet another strategy for a solar array is schematically illustrated in FIG. 9. This array 60 comprises three layers 61a–c which are separated from each other by a distance of approximately 70 cm. and include photocell elements (not illustrated) which are 1 cm. square. Layer 61a is completely covered with photocells while layers 61b–c are partially covered with photocells. The array also includes a pair of side panels 62a–b. Panel 62b is oriented to receive the penumbral radiation that passes through layer 61b when the sun is rising in the sky, for example, at 9 a.m. Similarly, panel 62a is positioned to be in the penumbra of layer 61b when the sun is setting, for example, at 3 p.m. Naturally, panels 62a–b will also at times receive direct radiation from the sun, dependent upon the position of the sun. The various panels in the array will produce peak power output at different times of the day. Their total power output during the course of the day thus remains relatively stable for a relatively long period of time when compared to conventional fixed arrays.

While a number of illustrative embodiments of the invention have been described, it is understood that various devices utilizing the concept of the present invention will be obvious to those skilled in the art and such devices are intended to be within the scope of the invention as limited only by the appended claims.

What is claimed is:

1. A multi-layer of panel of power converting elements for converting electromagnetic energy incident on said panel to another form of energy, said electromagnetic energy supplied by a source having a first width and emitting electromagnetic energy from a plurality of points which are spaced from each other along said first width, said panel comprising:
   a. first energy converting means having a second width and being disposed a first distance from said source, the projection of said first energy converting means on an imaginary sphere being defined by the source being spaced from said first energy converting means by said first distance from the source; and
   b. second energy converting means disposed adjacent said first energy converting means and spaced from said first energy converting means by a second distance which is at least 1/5 the quantity defined by the product of said first distance multiplied by said second width and divided by said first width.

2. A multi-layer panel of power converting elements as in claim 1, wherein said first energy converting means comprises a plurality of individual power converting elements forming a first layer and said electromagnetic energy being light.

3. A multi-layer panel of power converting elements as in claim 2, wherein said first layer includes spaces which allow the light to pass through said first layer between said individual power converting elements to said second energy converting means.

4. A multi-layer panel of power converting elements as in claim 3, wherein said energy converting elements are photovoltaic cells.

5. A multi-layer panel of power converting elements as in claim 3, wherein said second energy converting means is a substantially continuous layer of photocells, whereby the light is substantially completely blocked from passing through said substantially continuous layer.

6. A multi-layer panel of power converting elements as in claim 5, wherein said first layer and said continuous layer are substantially parallel to each other.

7. A multi-layer panel of power converting elements as in claim 5, further comprising a third layer of individual power converting elements, said third layer also being disposed adjacent said first layer, said third layer including spaces which allow the light to pass through said third layer between said individual power converting elements to said continuous layer.

8. A multi-layer panel of power converting elements as in claim 7, wherein said power converting elements are photovoltaic cells.

9. A multi-layer panel of power converting elements as in claim 1, wherein said first energy converting means has a first area and said second energy converting means has a second area, said second area being greater than said first area.

10. A multi-layer panel of power converting elements as in claim 9, wherein said power converting elements are photovoltaic cells.

11. An array of multi-layer panels of power converting elements for converting electromagnetic energy incident on said array to another form of energy, said electromagnetic energy supplied by a source having a first width and emitting electromagnetic energy from a plurality of points which are spaced from each other along said first width, said array comprising at least two of said panels, said panels oriented in fixed positions in different directions with respect to the sun, whereby each of said panels produces its peak power output at a different time of the day, each of said panels comprising:
   a. first energy converting means having a second width and being disposed a first distance from said source, the projection of said first energy converting means on an imaginary sphere being defined by the source being spaced from said first energy converting means by said first distance from the source; and
   b. second energy converting means disposed adjacent said first energy converting means and spaced from said first energy converting means by a second distance which is at least 1/5 the quantity defined by the product of said first distance multiplied by said second width and divided by said first width.

12. An array of multi-layer panels as in claim 11, wherein said first energy converting means comprises a plurality of individual power converting elements forming a first layer and said electromagnetic energy being light.

13. An array of multi-layer panels as in claim 12, wherein said first layer includes spaces which allow the light to pass through said first layer between said individual power converting elements to said second energy converting means.

14. An array of multi-layer panels as in claim 13, wherein said second energy converting means is a substantially continuous layer of photocells, whereby the light is substantially completely blocked from passing through said substantially continuous layer.

15. An array of multi-layer panels as in claim 14, further comprising a third layer of individual power converting elements, said third layer also being disposed adjacent said first layer, said third layer including spaces which allow the light to pass through said third layer between said individual power converting elements to said continuous layer.

16. An array of multi-layer panels as in claim 11, wherein said first energy converting means has a first area and said second energy converting means has a second area, said second area being greater than said first area.

17. An array of multi-layer panels as in claim 11, wherein said panels are so positioned with respect to each other that they may be fixedly positioned with respect to the sun in such a manner that during at least a portion of the day at least some of the light incident on one of the panels and not absorbed by that panel is reflected onto the other panel.

* * * * *